United States Patent [19]

Underwood

[11] Patent Number: 4,761,801
[45] Date of Patent: Aug. 2, 1988

[54] LOOK AHEAD TERMINAL COUNTER

[75] Inventor: George D. Underwood, Inglewood, Calif.

[73] Assignee: Hughes Aircraft Company, Los Angeles, Calif.

[21] Appl. No.: 875,894

[22] Filed: Jun. 18, 1986

[51] Int. Cl.$^4$ .................... H03K 21/40; G06F 11/00
[52] U.S. Cl. ........................................ 377/33; 377/29; 377/44; 377/55; 377/56; 377/106
[58] Field of Search ............... 377/28, 27, 29, 111, 377/114, 115, 116, 67, 70, 33, 44, 49, 39, 55, 56, 52, 110, 106; 307/272 A; 371/25; 324/73 R

[56] References Cited

U.S. PATENT DOCUMENTS

| | | | |
|---|---|---|---|
| 2,566,085 | 8/1951 | Green | 377/106 |
| 3,548,319 | 12/1970 | Price | 377/111 |
| 3,609,311 | 9/1971 | Wayne | 377/52 |
| 3,761,695 | 9/1973 | Eichelberger | 371/25 |
| 4,493,077 | 1/1985 | Agrawal et al. | 371/25 |
| 4,596,027 | 6/1986 | Bernardson | 377/106 |
| 4,621,201 | 11/1986 | Amdahl et al. | 324/73 R |
| 4,630,270 | 12/1986 | Petit et al. | 324/73 R |
| 4,636,716 | 1/1987 | Welzhofer | 324/73 R |

Primary Examiner—John S. Heyman
Attorney, Agent, or Firm—Charles D. Brown; A. W. Karambelas

[57] ABSTRACT

A look ahead terminal counter and a method for generating a terminal count output signal are disclosed. The counter comprises a plurality of counter registers connected to counter enable circuitry for sequencing the registers at a predetermined counter rate. Terminal count enable circuitry is connected to the counter circuitry, e.g. at the input ports of the counter registers, and is operative to generate a terminal count enable signal when those input ports are at a predetermined state. The terminal count enable signal and clock signal are communicated to an output register operative to generate a terminal count output signal when a clock signal is received during the simultaneous presence of the terminal count enable signal.

8 Claims, 2 Drawing Sheets

LOOK AHEAD TERMINAL COUNTER

STATEMENT AS TO RIGHTS TO INVENTIONS MADE UNDER FEDERALLY-SPONSORED RESEARCH AND DEVELOPMENT

The government has rights in this invention pursuant to Purchase Order No. E31011L, under Contract No. F33615-83-C-0043, awarded by the Department of the Air Force.

CROSS REFERENCE TO A RELATED APPLICATION

This application is related to U.S. application Ser. No. 875,895, titled Multi-Mode Counter Network, filed concurrently herewith by the same inventor.

BACKGROUND OF THE INVENTION

The present invention relates to counters and, more particularly, to a look ahead terminal counter circuitry for reducing propagation delays within the counter network and eliminating false output signals due to transient conditions within the counter network.

Generally, a counter is a device capable of changing from one to another distinguishable state. Counters are operative to change states, and thereby produce one or more output signals, upon receipt of some predetermined number of input pulses. A plurality of counter stages are frequently cascaded together to perform digital counting. A component such as a register is used to generate and store counter output signals representative of the number of input pulses, or the number of occurrences of a particular event of interest. Outputs from the registers can be connected to associated combinational logic that is constructed to generate a state decode output signal when the register outputs are at predetermined states, e.g., when all the register outputs are at a one state, commonly known as terminal count. It is to be understood, however, that different combinational logic can be used to generate a state decode output signal when the register outputs are at any predetermined state.

Thus, as used hereinafter, the signal terminal count (TC) shall be used generally to represent a state decode output signal generated in response to register outputs at any predetermined state.

Counters are frequently used in computer networks, in combination with a variety of different types of combinational logic to perform numerical functions that allow the computer to solve problems relating to combinations, permutations and/or selection of discrete data from a large pool of input data.

For example, various types of combinational logic may be interconnected with counter networks to analyze the various ways in which discrete objects may be combined and permuted. One might wish to select r objects from n distinct objects for repetitive selection of the same object. In less technical terms, the combinational logic and an associated counter network can operate to sort a large volume of input data into definable groups having some common characteristics. One such application would be to segregate components of radar return signals indicative of the presence of a moving target, or to segregate incident x-ray signals having signal components representative of the existence of cancerous growths in a patient. Such applications typically require a generation of complex signals representative of numerical functions, combination of input data with those functions and an analysis of the recurrence of predetermined signal patterns within the combination. Circuitry to perform those functions include complex combinational logic and an extended number of counters operatively associated with that combinational logic.

Frequently counter networks and combinational logic are not segregatable with respect to testing procedures such that it is impossible to differentiate between a failure in the combinational logic and a failure in the counter network. Moreover, a plurality of counter stages may be "buried" within a larger circuit such that it is almost impossible to identify where any failure may be located. Additionally, where the counter must be sequenced through its entire operational cycle to generate an output signal, the time necessary to perform such a test may be unacceptably long and the information obtained from the test procedure may be limited to simple determination of whether the overall network performs as desired, without any differentiation regarding the source of any failure. Furthermore, as explained below, such a test will not necessarily identify failures that may appear at states other than the final state of the counter network. Consequently, the information obtained from such contemporary testing procedures is too little, and the time necessary to obtain that information is too long.

In order to facilitate the testing of counters utilized in digital processing systems it is customarily necessary to apply a large number of clock pulses to the counter circuit and determine whether counter signals are being correctly generated in response to the appropriate number of clock pulses. In some cases it may be sufficient to confirm that the terminal count output of the counter network occurs after the correct number of clock pulses, i.e. that the counter network generates a terminal count output signal at the counter network cycle rate. However, as is well understood by those familiar with counter networks, a check of only the terminal count output signal does not insure that each individual counter register is operating correctly. This failure of individual counter register may result in the loss of information from combinational logic associated with an inoperative counter register, and the loss of intermediate output signals from the counter network. Such failures may, for example, occur where the output of one or more counter registers is stuck at a high level, and may not be detectable by a simple examination of the terminal count output of the counter network. Accordingly, it is frequently necessary to examine the output of each individual counter register after each clock pulse during one cycle. This procedure may be not only time consuming, but may also require an inordinate amount of dedicated storage and comparison circuitry. Where a plurality of counter stages are cascaded it is even more time consuming to compare the state of each counter register with the expected state after each clock pulse and counter enable pulses associated with a cycle of the counter, i.e. network cycle time.

Aside from failures associated with stuck counter registers, failures may result where the counter network, though operative to properly effect state changes in response to input signals, fails to enable generation of a terminal count signal soon enough after the appropriate clock pulse. Such failures are commonly referred to as race conditions. Other failures occur where, due to transient conditions within the counter network, a terminal count signal is generated at an inappropriate time. A brief explanation of how such false terminal count signals may be generated is believed to be useful for a more complete understanding of the present invention.

As previously indicated a counter network typically operates to generate a terminal count signal each time the counter network sequences through a predetermined number of clock pulses. After each counter register is sequenced to a desired output state, logic forming a portion of the counter network recognizes the existence of the desired state condition at each counter register and enables generation of a terminal count signal upon occurrence of the next clock pulse. Difficulties arise where, due to factors such as inherent propagation delays in the circuit components, the output state of the counter registers may briefly be in a state that enables the generation of a terminal count signal, though the counter has not yet received the desired number of input pulses. Consequently, if the next clock pulse occurs prior to the time the counter registers have completed transitioning to states corresponding to the current count, a false terminal count signal may be generated from the counter.

Thus, in addition to providing an improved technique for testing the operation of the counter and associated combinational logic the present invention is also directed to circuitry for reducing counter propagational delays and eliminating false output signals, associated with terminal count, as described more fully below.

Accordingly, the present invention is directed to a counter wherein each counter register may be separately tested without the need to sequence all counter registers and counter enable circuitry through the number of clock pulses corresponding to the network cycle time. The present invention further provides a counter network wherein an error may be resolved to a specific register or to combinational logic associated with a specific register. The present invention also provides a counter network wherein propagation delays and false output signals associated with terminal count can be reduced or eliminated. The counter network of the present invention is also intended to permit operation of the counter in a plurality of modes including a counting mode, a testing mode, a hold mode, a clear mode and a data loading mode, thereby rendering the counter network more versatile, more testable and more reliable.

SUMMARY OF THE INVENTION

A look ahead terminal counter and a method for generating a terminal count signal are disclosed. The counter comprises a plurality of counter registers connected to counter enable circuitry for sequencing the registers at a predetermined counter cycle rate. Output enable gating circuitry is connected to the input ports of the counter registers and is operative to generate a terminal count enable signal when those input ports are at a predetermined state. The terminal count enable signal and the clock signals are communicated to a terminal count output register operative to generate a terminal count signal when a clock signal is received during the simultaneous presence of the terminal count enable signal.

The clock rate is selected such that spurious terminal count enable signals generated as a result of transient conditions at the counter registers or associated combinational logic dissipate prior to the occurrence of the clock signal at the terminal count output register.

In an alternative embodiment inputs to the counter registers are provided by a plurality of multiplexers, the complementary outputs of which are used to generate the terminal count enable signal communicated to the terminal count output register.

DETAILED DESCRIPTION OF THE PRESENTLY PREFERRED EMBODIMENT

The detailed description set forth below in connection with the appended tables and drawing is intended merely as a description of the presently preferred embodiment of the invention, and is not intended to represent the only form in which the present invention may be constructed or utilized. The description sets forth the functions and sequence of events that are affected by the invention in connection with the illustrated embodiment. It is to be understood, however, that the same, or equivalent functions and sequences may be accomplished by different embodiments that are also intended to be encompassed within the spirit and scope of the invention.

Figure 1:
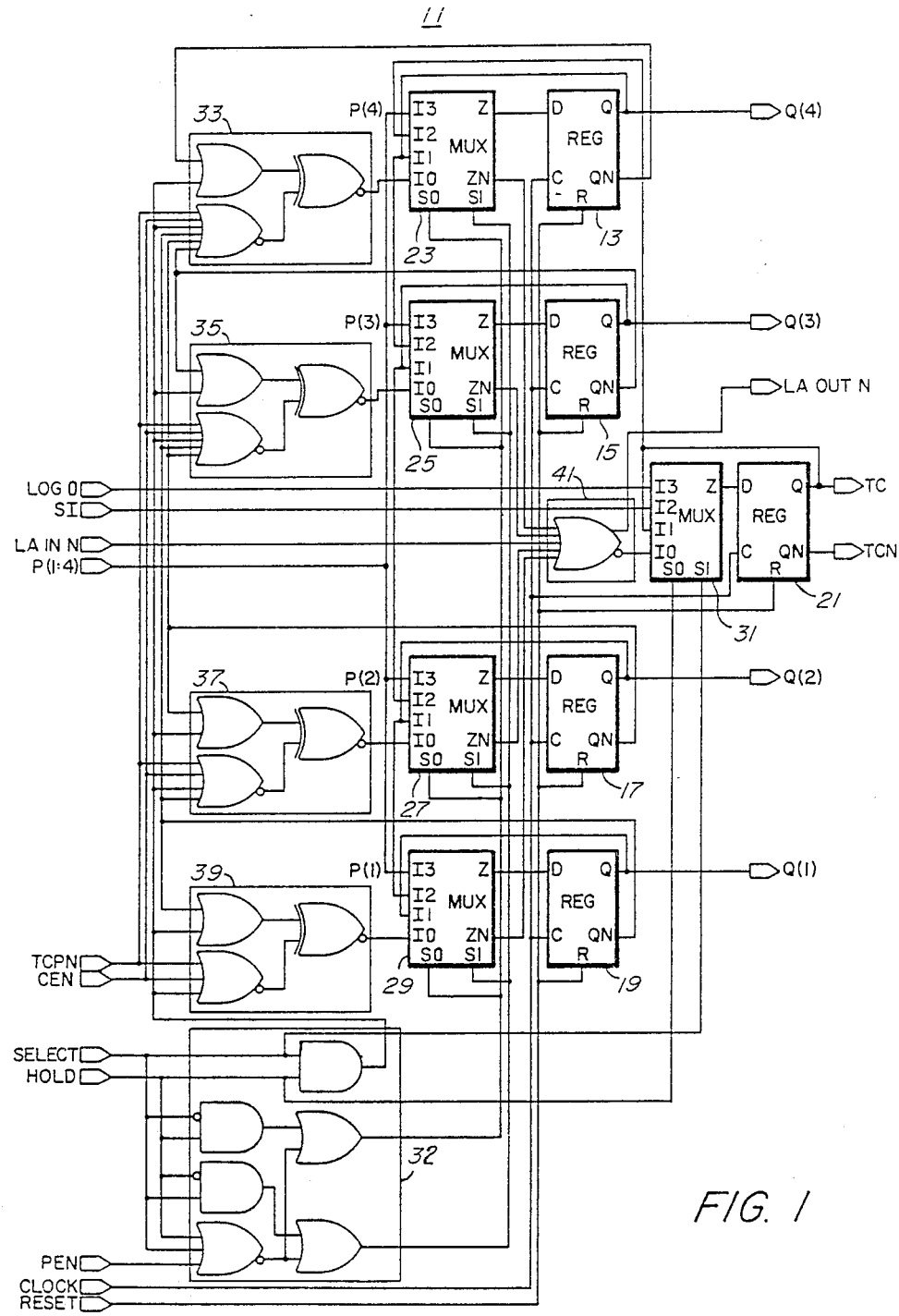
FIG. 1 is the circuit diagram illustrating an exemplary multi-mode counter incorporating look ahead terminal counter circuitry.

Referring to FIG. 1, an exemplary circuit is illustrated for providing the structure and functions of the present invention. An identification of the signals illustrated at FIG. 1 is provided in Table I, below.

TABLE 1

| IDENTIFICATION OF SIGNALS | | |
|---|---|---|
| NAME | | FUNCTION |
| LOG 0 | Logic Zero | Control function to clear or set terminal counter |
| SI | Serial Input | Test input stream |
| LA IN N | Look Ahead In Not | Look ahead signal from preceeding stage |
| P(1:4) | Parallel Input Signal | Four parallel input signals |
| TCPN | Terminal Count Prior Not | Complementary terminal count from preceeding stage |
| CEN | Count Enable Not | Complementary counter enable signal |
| SELECT | Select | Select input to multiplexers |
| HOLD | Hold | Hold counter |
| PEN | Parallel Enable Not | Complementary parallel load enable signal |
| CLOCK | Clock | Timing Signal |
| RESET | Reset | Reset asyncronous flip-flops |
| Q(1)–Q(4) | Counter Register Outputs | Counter register outputs |
| LA OUT N | Look Ahead Output Not | Complementary look ahead output signal |
| TC | Terminal Count | Terminal count |
| TCN | Terminal Count Not | Complementary terminal count |

As shown in FIG. 1 counter network 11 comprises a plurality of registers (REG) 13, 15, 17, 19 and 21. Each of the registers 13, 15, 17, 19 and 21 is preferably formed as a D flip-flop, and may be implemented as Model F100151 flip-flops manufactured by Fairchild Camera and Instrument Corporation.

The input to each of the registers are provided by an associated multiplexer (MUX) 23, 25, 27, 29 and 31, respectively, which may be implemented as Model F100171 multiplexers manufactured by Fairchild Instrument and Camera Corporation. As is well understood by those skilled in the art, the signal level output present at the Z output of each of the multiplexers is clocked into the associated register by the signal CLOCK, applied to the C input to the register. Consequently, the signal level present at the Z output of each of the multiplexers appears at the Q output of the associated register following the next CLOCK pulse. The time delay between the appearance of a signal level at the multiplexer Z output and the appearance of a corresponding signal at the Q output of the associated register is determined by two principal factors, i.e., the delay between the appearance of the multiplexer output and the occurrence of the next succeeding clock pulse, and the internal propagation delay of the register.

Each of the multiplexers 23, 25, 27, 29, and 31 is provided with a plurality of input ports I0, I1, I2, and I3. The multiplexers are controllable to communicate the signal on the selected one of the four input ports to the Z output of the multiplexer, in response to the control signals S0 and S1. Control signals S0 and S1 are generated by logic circuitry 32 in response to the externally generated signals SELECT, HOLD and PEN, as set forth below at Tables II, III and IV. Logic circuitry 32 is operative to translate the SELECT, HOLD, and PEN signals into appropriate S0 and S1 signals for selecting the proper input in response to the external signals.

Counter enabling circuitry consists of a plurality of logic circuits 33, 35, 37 and 39 operative to sequentially provide an input to the I0 port of multiplexers 23, 25, 27 and 29 respectively when network 11 is operaed in a counting mode. Logic circuits 33, 35, 37 and 39 cooperate with the multiplexers and registers to sequentially generate output signals from registers 13, 15, 17 and 19, respectively, upon the occurrence of a predetermined number of clock pulses. Upon proper sequencing of registers 13, 15, 17 and 19, then, register 21 is enabled, ultimately resulting in the generation of a terminal clock signal TC at the Q output of register 21.

Terminal count output enabling circuitry 41 is preferably formed as an or/nor gate connected to the complementary outputs (ZN) of multiplexers 23, 25, 27, and 29. Connection to the ZN outputs causes terminal count output enabling circuitry 41 to communicate an enable signal to the I0 input of multiplexer 31 when all of the ZN terminals are in a zero state, i.e. upon the occurrence of the clock pulse preceding the clock pulse generating the terminal count signal. Consequently, the Z output of multiplexer 31 and, therefore, the D input to register 21, are enabled in response to the clock pulse immediately preceeding the clock pulse that generates the terminal count signal. Upon the occurrence of the next CLOCK pulse the register 21 is caused to generate a terminal count (TC) signal. By use of terminal count output enabling circuitry 41 a look ahead terminal count scheme is effected such that the generation of the terminal count signal TC is delayed beyond the occurrence of the corresponding clock pulse signal by only the time corresponding to the propagation delay inherent in the operation of register 21. It is to be understood that by varying the circuitry used to form terminal count output enabling circuitry 41, or the connections thereto, a similar look ahead terminal count scheme may be effected to correspond with the generation of a terminal count signal in response to any predetermined number of clock pulses.

Moreover, the inclusion of register 21 prevents the generation of false terminal count signals where terminal count output enabling circuitry 41 generates a terminal count enable signal at the I0 port of multiplexer 31 in response to transient conditions of multiplexers 23, 25, 27 and 29. For example, as network 11 transitions from a count of 1101 to 1110 there may be a brief moment where the count will appear as 1111, resulting in a 0000 input to terminal count output enabling circuitry 41 and the consequent generation of a terminal count enable signal to be communicated to the I0 port of multiplexer 31. Where network 11 is in the counting mode this condition results in communication of a terminal count enable signal to the input to register 21. However, register 21 operates to isolate such transient conditions from the output of network 11 and will only generate an output when the register is enabled at the time a CLOCK signal is received. By that time, the transient conditions should be dissipated and the multiplexers should all be transitioned to their correct state. As will be recognized by those skilled in the art, the CLOCK rate should be selected with those transient conditions in mind and should allow sufficient time for the circuit components to complete transitioning between CLOCK pulses.

The present invention permits the counter network 11 to be tested without sequencing the registers and associated combinational logic through the entire network cycle. By controlling the state of S0 and S1, the test pattern input from the SI terminal can be input to multiplexer 23, and serially communicated through the remaining multiplexers and registers independent of the rate at which the terminal count signal is generated.

In the presently preferred embodiment a test pattern may be communicated from the serial input port (SI) to the test input port (I2) of multiplexer 31. When S0 and S1 are at appropriate levels each of the multiplexers 23, 25, 27, 29 and 31 will operate to output the signal present on the I2 input port of each associated multiplexer. That signal is then communicated to the D input port of the associated register. The signal is then communicated to the Q output port of that register and is, in turn, communicated to the I2 input port of another multiplexer. Thus, the output of register 21 is communicated to the I2 port of register 23. That signal is then communicated to the output of register 13 and then to the I2 input port register 25. The same signal is communicated to register 15 and then to the I2 input port of multiplexer 27. The output of register 17 is similarly communicated to the I2 input port of multiplexer 29. The output of multiplexer 29 is communicated to register 19 from which a serial output of the test pattern is discharged from terminal Q(1). Thus, the test pattern input to network 11 at terminal SI is serially communicated through each of the multiplexers and registers and is ultimately output from terminal Q(1). As noted above the rate at which the input test pattern is communicated through the multiplexers and registers is independent of the operation of the counter enabling circuitry 33, 35, 37, and 39. Accordingly, all multiplexers and registers may be tested in a convenient and expeditious manner, independent of any interconnected combinational logic or the rate at which the terminal count (TC) signal is generated, i.e. the network cycle time.

As shown at FIG. 1 test pattern outputs may also be obtained at terminals Q(2), Q(3), Q(4), and TC. Thus, the operation of each multiplexer and register pair may be independently checked. It should be noted, however, that failures may be resolved to a specific register using the serial output by shifting in predetermined data patterns, operating in count mode, shifting data through the network, and comparing the output to expected levels.

In addition to communicating the output of each register to the I2 input port of an unassociated multiplexer, the output of each register is also communicated to the I1 input port of the associated multiplexer. Upon the generation of appropriate S0 and S1 control signals (see Tables II, III and IV) each multiplexer is operative to communicate the signal appearing on the I1 input port to the associated register. Thus, the output of that register is maintained at its current level until the S0 or S1 signals change, or until the register is reset.

Counter network 11 may also operate to parallel load a plurality of data bits. In the presently preferred embodiment a plurality of data bits may be communicated to counter network 11 on the P terminal and communicated to multiplexers 23, 25, 27, and 29 at the I3 input ports of those multiplexers. Upon the appearance of appropriate PEN, SELECT and HOLD signal levels, the information appearing at the I3 input ports is communicated to the associated registers and ultimately output from the registers at the Q(1), Q(2), Q(3) and Q(4) terminals to external circuitry. Counter enabling circuitry 33, 35, 37, and 39, terminal count output enabling circuitry 41, register 21 and multiplexer 31 need not be used when the network 11 is disposed in the parallel load mode. When terminal count is parallel loaded into registers 13, 15, 17 and 19, a terminal count output signal is regenerated by register 21 in response to the same clock pulse used to parallel load the registers.

As mentioned above, network 11 may be used to facilitate checking the operation of external combinational logic connected to network 11. Where the output of some external combinational logic is communicated to the I3 input ports of the multiplexers for parallel loading, network 11 may be operated to input a limited amount of data from the external combinational logic, and then operated in a test mode to serially output the data trapped in the registers. Thus, the output of the external combinational logic can be held and serially output for comparison against expected levels. The operation of the external combinational logic may therefore be tested vis-a-vis the counter testing circuitry of network 11.

If desired, a plurality of counter networks 11 may be cascaded e.g., to facilitate higher order counts. In such a cascaded network the complementary terminal count signal (TCN) from the first stage serves as the complementary terminal count prior signal (TCPN) to the second stage. Similarly, the complementary look ahead output signal (LA OUT N) from the first stage serves as the complementary look ahead input signal (LA IN N) to the succeeding stage.

Similarly, the serial output signal from the Q(1) terminal of the first stage may be used as the serial input signal (SI) to the following stage. Thus, any number of stages may be cascaded without the need for external logic.

As previously discussed, various modifications, additions and substitutions may be effected to implement the structure and function of the component portions without departing from the spirit and scope of the invention. For example, other counter enabling circuitry and various alternate multiplexing schemes may be utilized to implement various counting schemes or interface various combinational logic circuitry within the scope of the invention. Additionally, it is clearly anticipated that the present invention may have application in various areas beyond those specifically addressed.

Figure 2:
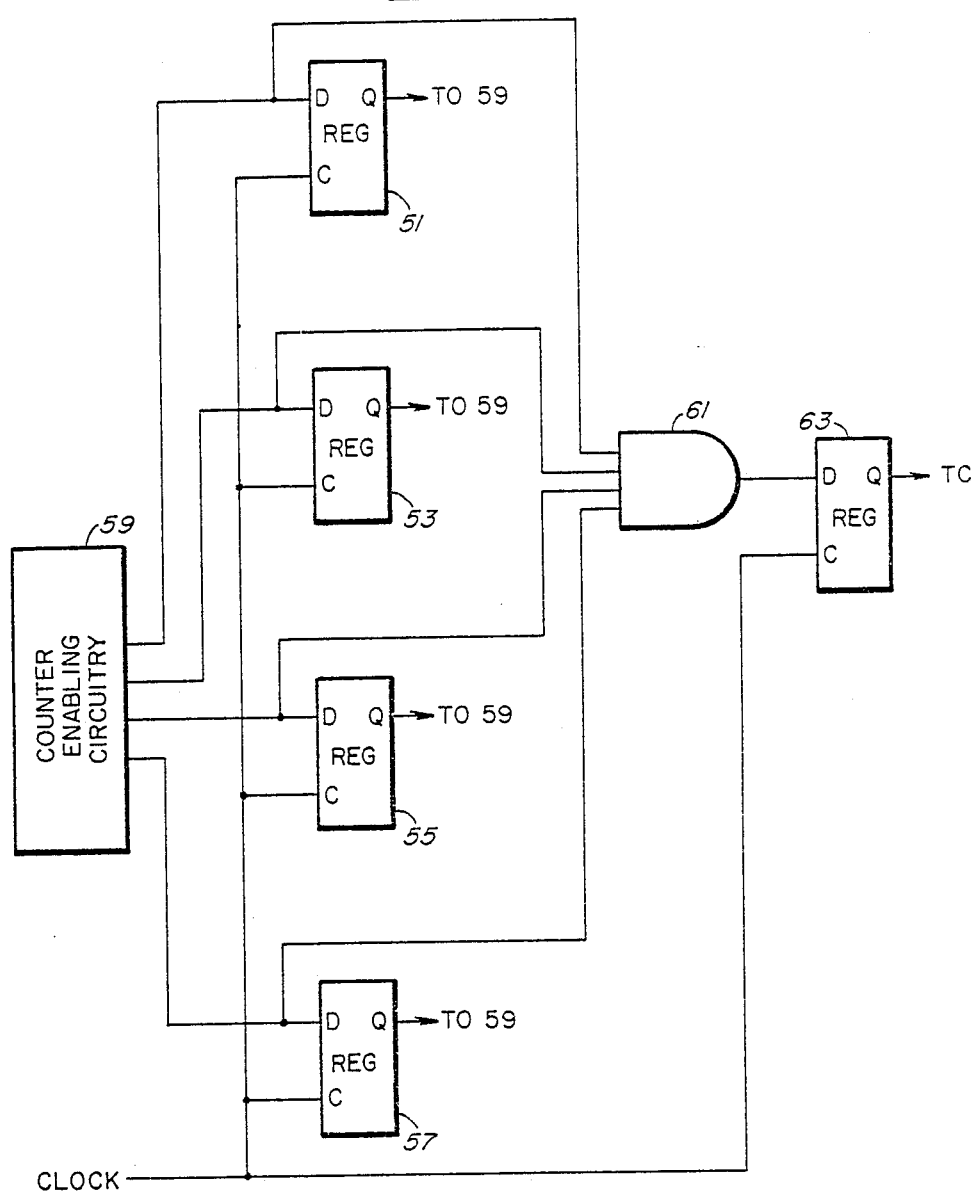
FIG. 2 is a circuit diagram of another embodiment of the look ahead terminal counter circuitry.

Referring to FIG. 2, another embodiment of a look ahead terminal counter 56 is illustrated for generating a terminal count output signal upon the occurrence of a predetermined number of clock pulses. The counter 56 is operative to reduce or eliminate spurious output signals resulting from transient conditions present at the counter registers. As with the circuit illustrated at FIG. 1, the counter 56 functions to isolate the output signal (TC) from spurious conditions and reduces delay time between the occurrence of the clock pulse generating the terminal count signal and the generation of the counter terminal count signal.

Counter 56 is formed of a plurality of counter registers 51, 53, 55, and 57. As will be recognized by those skilled in the art counter registers 51, 53, 55 and 57 may be formed of any of a number of commercially available registers such as the Model F100151 flip-flops manufactured by Fairchild Camera and Instrument Corporation. Each of the registers has an input port connected to counter enabling circuitry 59. The counter enabling circuit 59 may be similar to counter enabling circuitry 33, 35, 37 and 39, illustrated at FIG. 1, or may be implemented to enable the registers in any of a number of predetermined sequences e.g. base 3, 4, pseudo random, etc. Thus, after input of a predetermined number of clock pulses to the registers 51, 53, 55 and 57, the terminal count signal is generated and the counter cycle repeats.

In accordance with the present invention, inputs to the registers 51, 53, 55 and 57 are communicated to terminal count output enable logic circuitry 61, which may be implemented as a conventional AND gate. Logic circuitry 61 is operative to generate an output enable signal in response to predetermined conditions at the register input ports, and to communicate the enable signal to the input port of output register 63. The output register 63 is thus operative to generate a terminal count signal (TC) each time the counter 56 reaches the desired state.

Moreover, the terminal count enable signal output from terminal count output enable logic circuitry 61 is isolated from the output TC by register 63. The output signal from logic circuitry 61 is communicated to the input of register 63 and the terminal count output signal is generated only when an enable signal remains at the input to register 63 simultaneous with the occurrence of a clock pulse. The output from logic circuitry 61 is then used to trigger a terminal count output signal, rather than being itself an output signal, such that spurious output enable signals due to transient conditions within the counter registers and associated combinational logic will not result in false terminal count signals. The delay between the occurrence of the the terminal count clock pulse and the generation of the terminal count output signal is therefore limited to the inherent propagation delay of register 63.

As will be apparent to those skilled in the art various types of connecting schemes and combinational logic may be used to implement terminal count output enable logic circuitry 61. The central function of such logic being to generate a terminal count enable signal to register 63 sufficiently prior to the occurrence of the terminal count clock pulse such that spurious enable signals will dissipate prior to the time that the terminal count clock pulse occurs.

TABLE II

Enablement of Operational Modes

| SELECT | HOLD | FUNCTION |
|---|---|---|
| 0 | 0 | This is a counting or loading mode. If PEN is inactive the counter synchronously counts under the control of CEN. If PEN is active the counter will synchronously parallel load bits P(1) to P(4) where P(4) is MSB. |
| 0 | 1 | Hold mode. The counter will be held in its current state, i.e., $Q(t + 1) = Q(t)$. |
| 1 | 0 | Test mode. The counter will serial shift from the SI line through all the registers of the counter and out the Q(1) line. |
| 1 | 1 | Set mode. The counter registers will be synchronously set, e.g. to a zero state. |

TABLE III

Selected Inputs to Multiplexers 23, 25, 27, 29

| SELECT | HOLD | $S_0$ (PEN = 0) | $S_1$ (PEN = 0) | INPUT |
|---|---|---|---|---|
| 0 | 0 | 1 | 1 | $I_3$ |
| 0 | 1 | 1 | 0 | $I_1$ |
| 1 | 0 | 0 | 1 | $I_2$ |
| 1 | 1 | 1 | 1 | $I_0$ |

TABLE IV

Selected Inputs to Multiplexers 23, 25, 27, 29

| SELECT | HOLD | $S_0$ (PEN = 1) | $S_1$ (PEN = 1) | INPUT |
|---|---|---|---|---|
| 0 | 0 | 0 | 0 | $I_0$ |
| 0 | 1 | 1 | 0 | $I_1$ |
| 1 | 0 | 0 | 1 | $I_2$ |
| 1 | 1 | 0 | 0 | $I_0$ |

What is claimed is:

1. A look ahead terminal counter (56) comprising:
   a plurality of counter registers (51, 53, 55, 57), each of said counter registers having an enable input port, an output port and a clock input port;
   counter enabling circuitry (59) interconnected between the input and output ports of said plurality of counter registers and cooperating with said plurality of counter registers for sequencing the operation of said plurality of counter registers at a predetermined counter cycle rate determined by a clock signal at said clock input ports of said plurality of counter registers;
   terminal count output enabling circuitry (61) connected to said input ports of said plurality of counter registers, said terminal count output enabling circuitry generating an enable signal when signals at said input ports of said plurality of counter registers are at predetermined states determined by said counter enabling circuitry cooperating with said plurality of counter registers; and
   an output register (63), said output register having an enable input port connected to said terminal count output enabling circuitry (61) and a clock input port, said output register (63) generating an output signal in response to the receipt of said enable signal from said terminal count output enabling circuitry and a clock signal present at said clock input port.

2. The counter as recited in claim 1 wherein said output register is operative to generate an output signal in response to receipt of a clock pulse at said output register clock input port when said enable signal is simultaneously present at said enable input port.

3. The counter as recited in claim 2 wherein said logic circuitry is operative to communicate said output enable signal to said output register prior to the occurrence of said clock pulse.

4. A counter network for generating an output signal in response to occurrence of a predetermined number of clock pulses comprising:
   a plurality of counter registers, each of said counter registers having a counter input port, a clock input port and a counter output port;
   a plurality of multiplexers, each of said multiplexers having an input port and first and second output ports, said first output ports being connected to the counter input port of a respective one of said plurality of counter registers, said output ports of said plurality of counter registers connected to respective input ports of said multiplexors, each of said plurality of multiplexers being operative to gate signals to the input ports of said plurality of counter registers;
   terminal count output enabling circuitry, said output enabling circuitry having a plurality of input ports and an output port, said input ports being connected to said plurality of mulitplexers at said second output ports thereof, said output enabling circuitry generating a terminal count enable signal upon receipt of predetermined signals from said plurality of multiplexers; and
   a terminal count output register, said output register comprising an enable input port, a clock input port and a terminal count output port, said enable input port being connected to said terminal count output enabling circuitry output port, said output register generating a terminal count output signal in response to receipt of said enable signal at said enable input port wherein each of said plurality of counter registers and said terminal count output registers and said terminal count output register are responsive to said predetermined number of clock pulses.

5. The network as recited in claim 4 wherein said output register is operative to generate said terminal count output signal in response to receipt of a clock pulse at said output register clock input port when said enable signal is simultaneously present at said enable input port.

6. A method of generating a terminal count output signal from a counter network comprising:
   connecting each input port of a plurality of counter registers to enable logic circuitry;
   generating a terminal count enable signal when said counter register inputs are at predetermined states;
   communicatng said terminal count enable signal to a terminal count register prior to occurrence of a clock pulse corresponding to generation of a terminal count output signal; and
   generating a terminal count output signal from said terminal count output register in response to the simultaneous presence of said enable terminal count signal and a clock pulse.

7. The method as recited in claim 6 further including the step of communicating signals from the inputs of said counter registers to said enable logic circuitry sufficiently prior to the occurence of said clock pulse such that false terminal count enable signals due to transient conditions of the signals at the counter register inputs are dissipated prior to the occurrence of said clock pulse.

8. A digital counter providing a look-ahead terminal count signal comprising:
 a plurality of registers each having an input port and a clock port and a output port;
 counter enabling circuitry for gating signals from the output ports of the plurality of registers to the input ports of the plurality of registers so that counting will transpire in response to a clock signal received at the clock ports of the plurality of registers;
 terminal count output enabling circuitry for receiving from the counter enabling circuitry equivalent signals to those signals which are gated by the counter enabling circuitry to the plurality of registers and for, responsive to these received signals, developing a terminal count enable signal when predetermined signals are received;
 a terminal count output register, having an input port and a clock port and an output port, for generating a terminal count output signal at its output port responsively to a clocking by the clock signal which is received at its clock port of the terminal count output register and an enable signal which is received at its input port.

* * * * *